US00RE36217E

United States Patent [19]

Petersen

[11] E Patent Number: Re. 36,217

[45] Reissued Date of Patent: Jun. 1, 1999

[54] TOP LOAD SOCKET FOR BALL GRID ARRAY DEVICES

[75] Inventor: Kurt H. Petersen, Austin, Tex.

[73] Assignee: Minnesota Mining and Manufacturing Company, St. Paul, Minn.

[21] Appl. No.: 08/927,763

[22] Filed: Jun. 19, 1997

Related U.S. Patent Documents

Reissue of:

[64] Patent No.: 5,498,970
Issued: Mar. 12, 1996
Appl. No.: 08/384,663
Filed: Feb. 6, 1995

[51] Int. Cl.[6] ..... G01R 1/04; H01R 13/629; H01R 13/62

[52] U.S. Cl. ..... 324/755; 439/261; 439/268

[58] Field of Search ..... 324/754, 755, 324/756, 758, 763, 765; 439/73, 74, 261, 266, 268

[56] References Cited

U.S. PATENT DOCUMENTS

| | | | |
|---|---|---|---|
| 2,261,761 | 11/1941 | Hanson et al. | 173/328 |
| 3,569,905 | 3/1971 | Kehagtoglou | 339/75 |
| 3,763,459 | 10/1973 | Millis | 339/75 M |
| 3,848,221 | 11/1974 | Lee, Jr. | 339/74 R |
| 4,012,099 | 3/1977 | Worcester | 339/75 M |
| 4,314,736 | 2/1982 | Demnianiuk | 339/74 R |
| 4,340,266 | 7/1982 | Grovender | 339/17 CF |
| 4,343,524 | 8/1982 | Bright et al. | 339/74 R |
| 4,351,580 | 9/1982 | Kirkman et al. | 339/17 CF |
| 4,376,560 | 3/1983 | Olsson et al. | 339/17 CF |
| 4,395,084 | 7/1983 | Conrad | 339/75 MP |
| 4,396,935 | 8/1983 | Schuck | 357/74 |
| 4,420,205 | 12/1983 | Kirkman | 339/74 R |
| 4,468,072 | 8/1984 | Sadigh-Behzadi | 339/74 R |
| 4,505,532 | 3/1985 | Hine et al. | 339/75 M |
| 4,509,812 | 4/1985 | Lotter | 339/75 M |
| 4,554,505 | 11/1985 | Zachry | 324/158 F |
| 4,669,796 | 6/1987 | Carter | 439/372 |

(List continued on next page.)

FOREIGN PATENT DOCUMENTS

| | | | |
|---|---|---|---|
| 6276273 | 6/1985 | Japan | H01R 33/76 |
| 6276274 | 6/1985 | Japan | H01R 33/76 |
| 2-309579 | 1/1989 | Japan | H01R 33/76 |
| 3-34279 | 1/1989 | Japan | H01R 33/76 |
| 2-28624 | 7/1990 | Japan | H01L 29/78 |
| 2169154 | 11/1985 | United Kingdom | H01R 0/09 |
| 2274212 | 7/1994 | United Kingdom | G01R 1/067 |

*Primary Examiner*—Glenn W. Brown
*Attorney, Agent, or Firm*—Darla P. Fonseca

[57] ABSTRACT

A test socket for temporary connection of a ball grid array integrated circuit device to a test circuit includes an array of contacts each including two cantilever arms biased toward each other and terminating in tips adapted to capture one ball of the device.

63 Claims, 6 Drawing Sheets

U.S. PATENT DOCUMENTS

| | | | |
|---|---|---|---|
| 4,692,790 | 9/1987 | Oyamada | 357/79 |
| 4,715,823 | 12/1987 | Ezura et al. | 439/267 |
| 4,744,009 | 5/1988 | Grabbe et al. | 361/398 |
| 4,744,768 | 5/1988 | Rios | 439/262 |
| 4,750,891 | 6/1988 | Egawa | 439/259 |
| 4,758,176 | 7/1988 | Abe et al. | 439/331 |
| 4,768,973 | 9/1988 | Bakermans | 439/331 |
| 4,783,719 | 11/1988 | Jamison et al. | 361/398 |
| 4,801,273 | 1/1989 | Ikeya et al. | 439/269 |
| 4,832,612 | 5/1989 | Grabbe et al. | 439/71 |
| 4,836,798 | 6/1989 | Carter | 439/268 |
| 4,846,703 | 7/1989 | Matsuoka et al. | 439/71 |
| 4,846,704 | 7/1989 | Ikeya | 439/72 |
| 4,859,189 | 8/1989 | Petersen et al. | 439/66 |
| 4,923,404 | 5/1990 | Redmond et al. | 439/71 |
| 4,949,159 | 8/1990 | Petry, Jr. et al. | 357/70 |
| 4,950,980 | 8/1990 | Pfaff | 439/296 |
| 4,969,828 | 11/1990 | Bright et al. | 439/68 |
| 4,986,760 | 1/1991 | Petersen et al. | 439/71 |
| 4,988,310 | 1/1991 | Bright et al. | 439/342 |
| 5,002,499 | 3/1991 | Matsuoka | 439/342 |
| 5,010,038 | 4/1991 | Fox et al. | 437/215 |
| 5,013,256 | 5/1991 | Matsuoka et al. | 439/264 |
| 5,057,031 | 10/1991 | Sinclair | 439/261 |
| 5,059,135 | 10/1991 | Matsuoka et al. | 439/268 |
| 5,068,601 | 11/1991 | Parmenter | 324/158 F |
| 5,088,190 | 2/1992 | Malhi et al. | 29/843 |
| 5,123,855 | 6/1992 | Petersen | 439/263 |
| 5,147,213 | 9/1992 | Funk et al. | 439/266 |
| 5,158,467 | 10/1992 | Grabbe et al. | 439/71 |
| 5,161,984 | 11/1992 | Taylor et al. | 439/73 |
| 5,167,326 | 12/1992 | Murphy | 206/331 |
| 5,199,890 | 4/1993 | Kubo | 439/72 |
| 5,234,349 | 8/1993 | Matsuoka et al. | 439/70 |
| 5,322,446 | 6/1994 | Cearley-Cabbiness | 439/73 |
| 5,342,213 | 8/1994 | Kobayashi | 439/268 |
| 5,374,888 | 12/1994 | Karasawa | 324/765 |
| 5,376,010 | 12/1994 | Petersen | 439/71 |
| 5,545,050 | 8/1996 | Sato et al. | 439/73 X |

TOP LOAD SOCKET FOR BALL GRID ARRAY DEVICES

Matter enclosed in heavy brackets [ ] appears in the original patent but forms no part of this reissue specification; matter printed in italics indicates the additions made by reissue.

FIELD OF THE INVENTION

The present invention relates generally to sockets for the temporary connection of electronic devices to test circuitry, and, more particularly, sockets for ball grid array devices.

BACKGROUND OF THE INVENTION

Integrated circuit (IC) devices are finding wide-spread use in the electronics industry and before they are bonded to a circuit the same are tested to determine whether the IC device is functioning and that electrical continuity is present between the various portions of the device. To do this, the IC is placed in a socket which is attached to test circuitry. The whole assembly of test circuitry and IC may also be subjected to elevated temperatures while the IC is being electrically tested. Thus the procedure may be referred to as "test and burn-in" and the socket a test and burn-in socket.

One type of IC device is formed merely with small balls of solder attached to one planar surface of the device in a regular array of equally spaced rows and columns. Such a device is called a ball grid array (BGA) device and is designed to be mated to an interface circuit board by reflow soldering the BGA solder balls to an equal number of pads on the circuit board.

Test sockets for BGA devices in the past have contacted the solder balls with a single beam contact or a pointed rod contact which have caused undesirable damage to the solder balls or imparted unbalanced forces to the BGA device which had to be countered by the structure of the socket. It would be desirable to provide a socket which eliminated these undesirable effects.

SUMMARY OF THE INVENTION

The present invention improves upon existing BGA test sockets by providing a contact for each ball which is comprised of two cantilever arms terminating in inwardly-bent contact tips. The arms are arranged to be biased toward each other in the manner of a pair of tweezers. Since there are two contact arms, the forces on the contact balls of the BGA are balanced and thus no forces are transmitted to either the IC device or the socket structure supporting the contacts. Because the tips are inwardly bent, the balls are positively captured and the IC device securely maintained within the socket.

In particular, the test socket of the present invention includes a base of electrically insulating material, an array of contacts supported by the base, the array at least including a pattern of contacts corresponding to the ball grid array of the integrated circuit device, each contact including a set of two cantilever arms biased toward each other and terminating in tips adapted to capture one ball of the ball grid array integrated circuit device, and means for simultaneously separating each of the sets of the array of contacts so that the balls of the ball grid array device may be inserted one within each of the set of contact arms.

BRIEF DESCRIPTION OF THE DRAWINGS

The present invention will be more thoroughly described with respect to the accompanying drawings, wherein like numbers refer to like parts in the several views, and wherein.

DESCRIPTION OF THE PREFERRED EMBODIMENT

Figure 1:
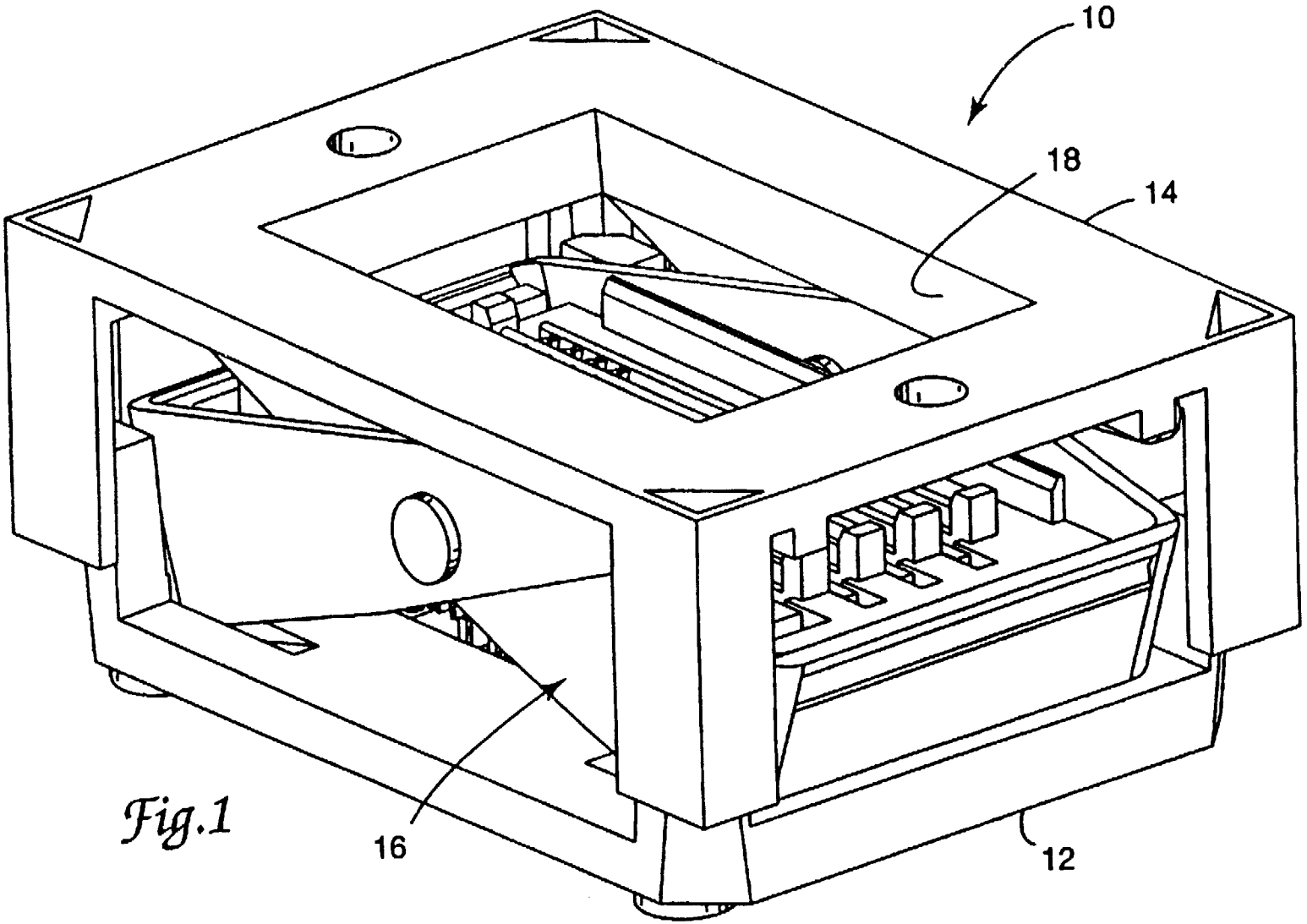
FIG. 1 is a perspective view of a BGA test socket according to the present invention.

FIG. 1 illustrates a ball grid array (BGA) socket generally indicated as 10. The socket 10 includes a base 12 of electrically insulating material, a cover 14 and an operating mechanism 16 disposed between the base 12 and the cover 14. The cover 14 includes an opening 18 in the shape of the BGA integrated circuit device (not shown) with which the socket 10 is to be used.

Figure 2:
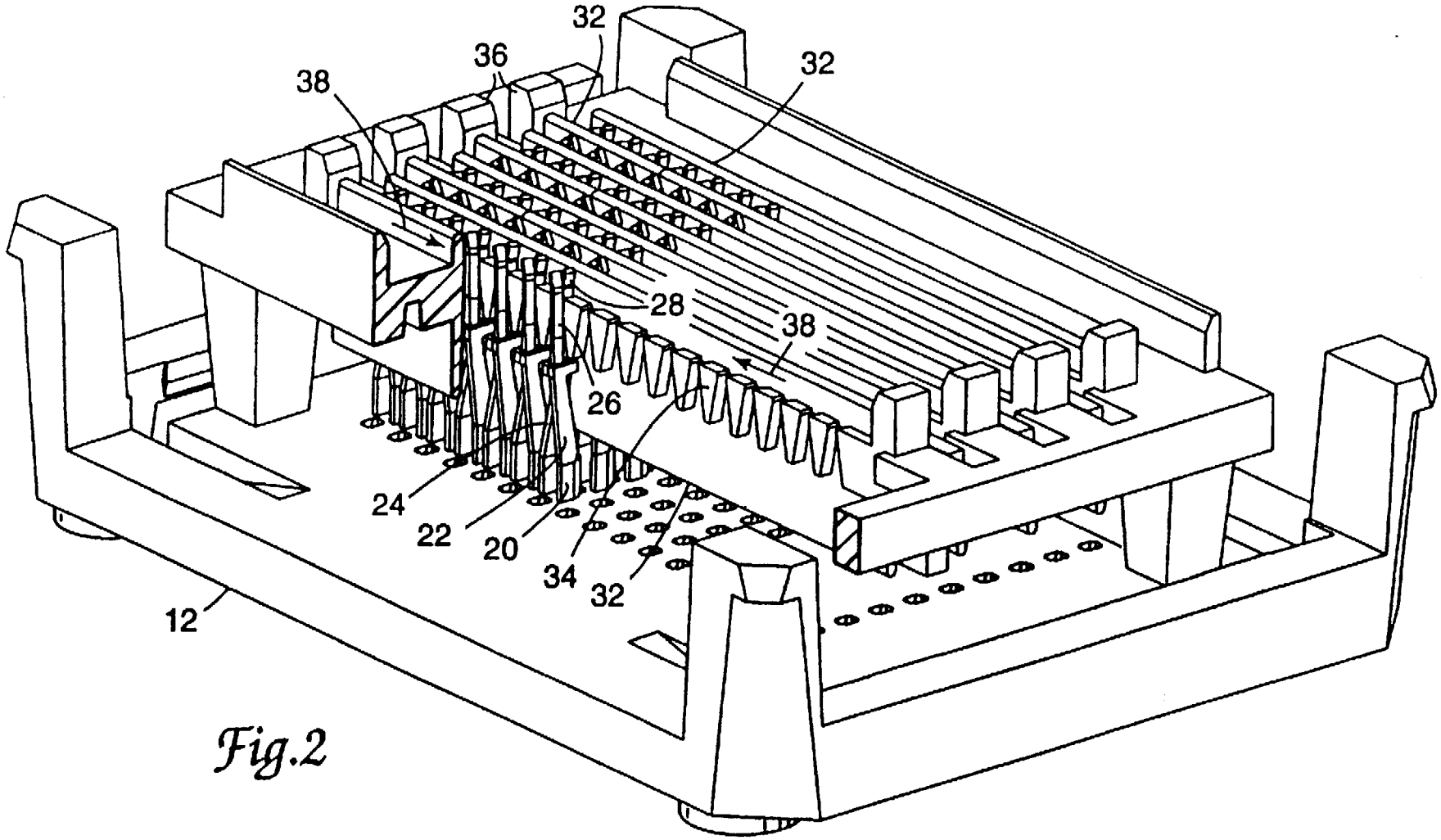
FIG. 2 is a perspective view of a pair of contacts designed for use in the socket of FIG. 1.
Figure 3:
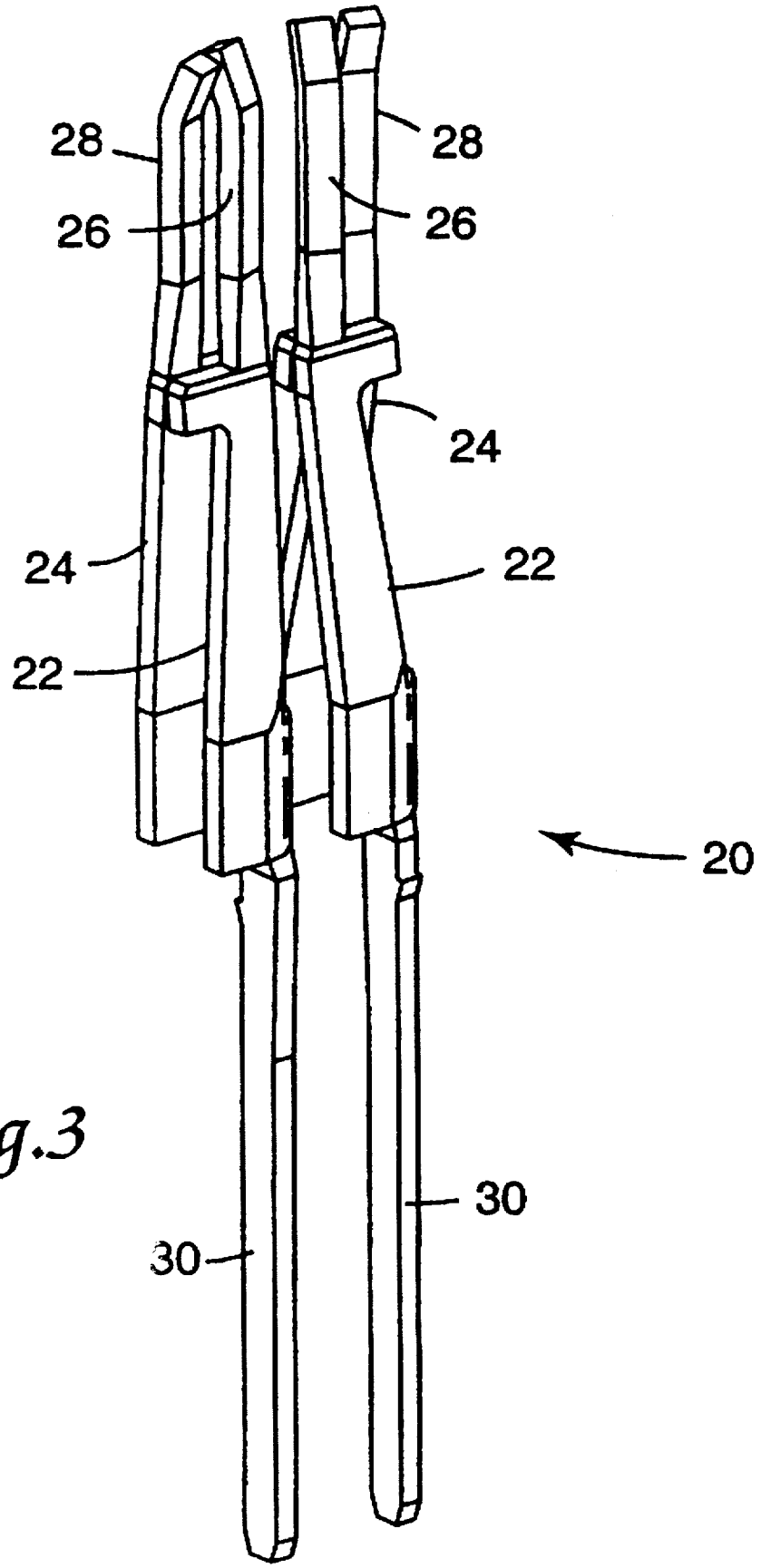
FIG. 3 is a perspective view of a portion of the socket of FIG. 1 illustrating the relationship between the contacts of FIG. 2 and the BGA IC device which is to be tested.

FIGS. 2 and 3 illustrate the contacts 20 disposed within the operating mechanism 16 of the socket 10 which are designed to make an electrical connection with the BGA device. Each contact 20 includes two cantilever arms 22 and 24 which terminate in tips 26 and 28 offset from each other relative to the direction of travel of the arms 22 and 24. The arms 22 and 24 are of a resilient, highly conductive metal such as copper or an alloy of copper, and so attempt to return to the position shown in FIG. 3 when the tips 26 and 28 are spread apart. The contacts 20 further include a tail 30 for electrical contact to a circuit board or the like.

FIG. 2 shows the tails 30 of the contacts inserted through the base 12, with the contacts arranged in an array of rows and columns. Located between adjacent rows of contacts 20 are racks 32 having attached thereto triangular projections 34 which engage the tip portions 26 and 28 of the contacts 20. The racks 32 are connected at one end to a guide 36 which moves with the rack 32 to move as will be described below. It can be seen in FIG. 2 that every other rack illustrated is connected to one of the guides 36 illustrated. This arrangement is such that every other rack 32 travels in the same direction with intermediate racks 32 traveling in the opposite direction. The direction of travel of two adjacent racks 32 is indicated by the arrows 38.

It will be noted that the tips 26 and 28 of adjacent rows of contacts 20 are offset in opposite directions, this allows one rack 32 with triangular projections 34 on each side to operate on two tips 26, 28 of two rows of contacts 20 and so reduce the complexity of the mechanism involved.

Figure 4:
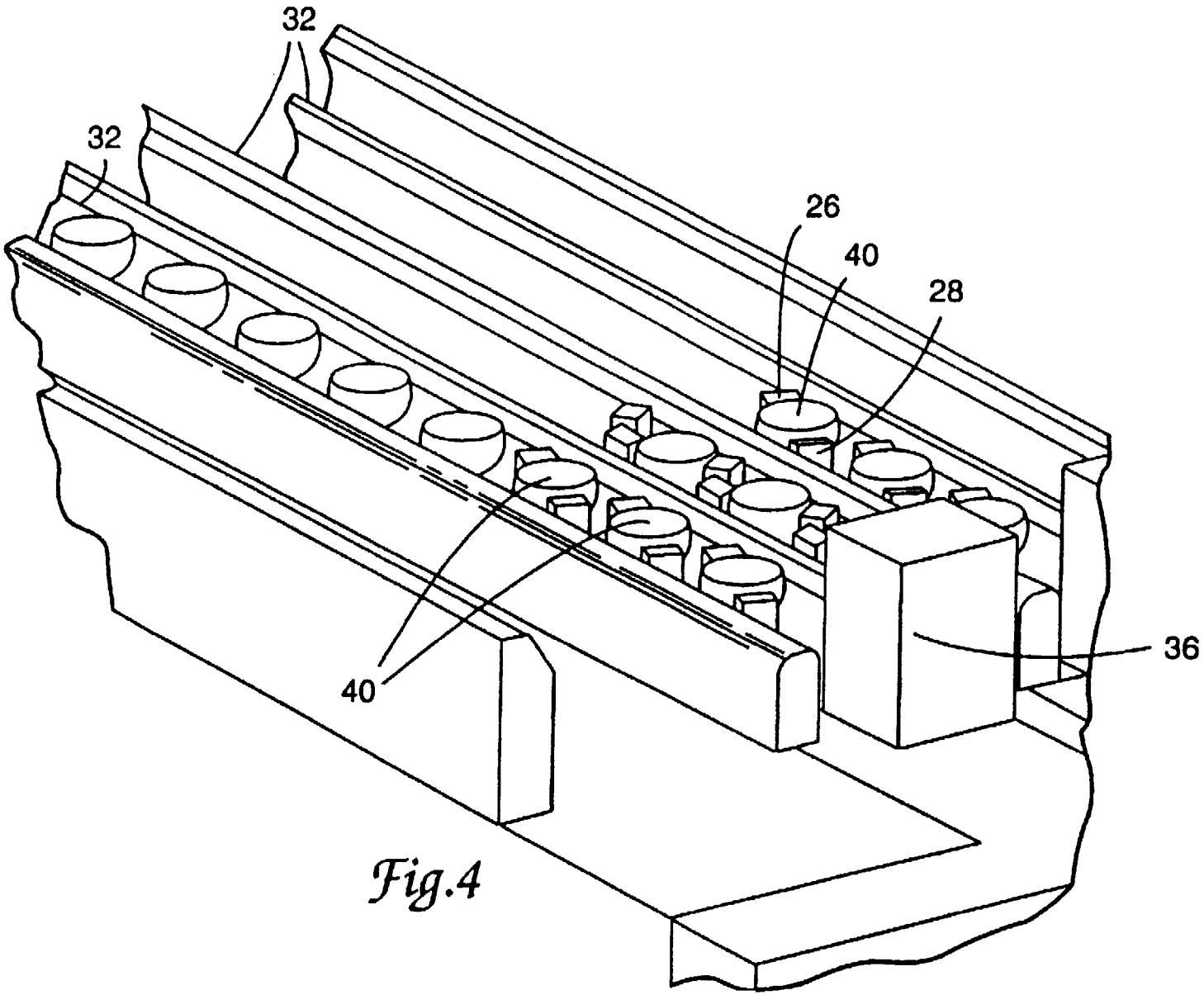
FIG. 4 is a perspective view, with a portion in cross-section, of contact actuating members of the test socket of FIG. 1.

FIG. 4 illustrates how the contacts 20 engage the solder balls 40 of a BGA device. The flat surfaces of the solder balls 40 indicate the plane at which the balls 40 are attached to the BGA device (not shown). As can also be seen in FIG. 3, the tips 26 and 28 of the contacts 20 are twisted toward each other so that the engagement surfaces of the tips 26 and 28 are tangential to the solder balls. This arrangement allows a maximum area of the contact tips 26 an 28 to contact the balls 40 and prevents any gouging of the balls 40. The amount of twist necessary to result in tangential engagement of the tips 26 and 28 and the solder balls 40 will depend upon the diameter of the balls 40. It will also be noted that the engagement portion of the tips 26 and 28 are bent inwardly where they engage the solder balls 40. This results in a downward force on the solder balls 40 which aids in the retention of the IC device within the socket 10.

Figure 5:
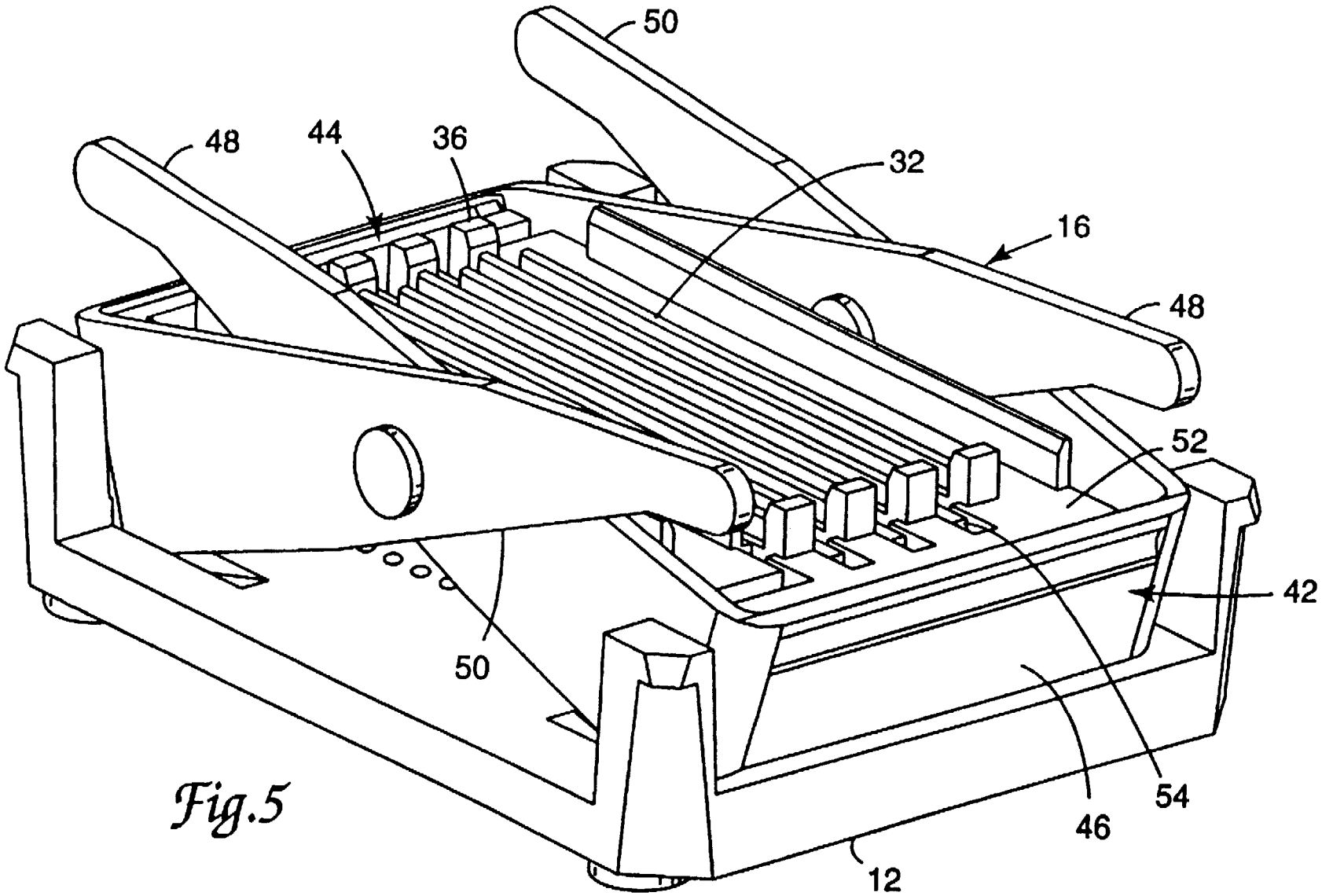
FIG. 5 is a perspective view of the test socket of FIG. 1 with the cover removed.
Figure 6:
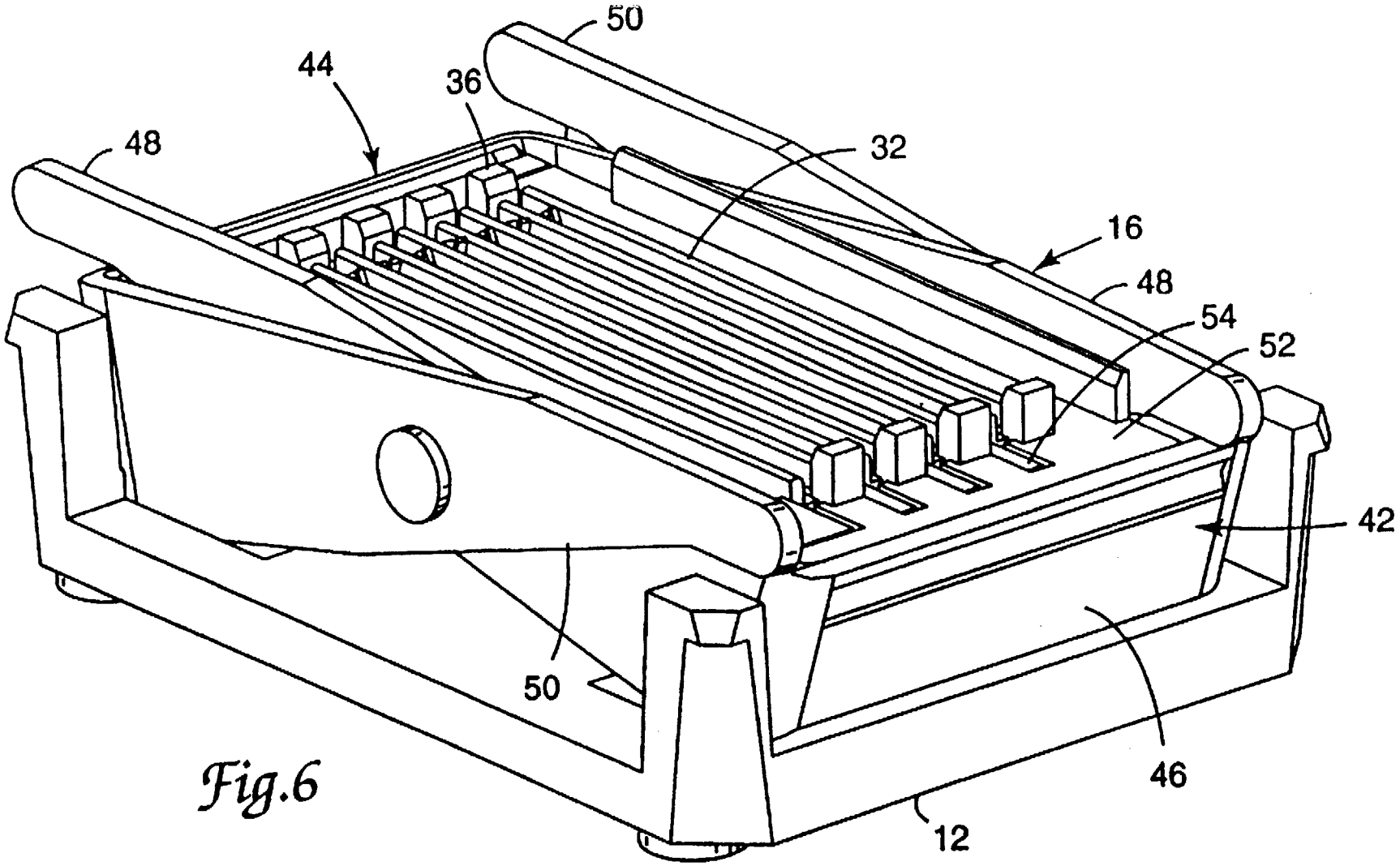
FIG. 6 is a view similar to that of FIG. 5 with the test socket in a position to accept a BGA device.

FIGS. 5 and 6 illustrate the socket 10 with the cover 14 removed to expose the operating mechanism 16 disposed within the socket 10. FIG. 5 illustrates the mechanism 16 in a position wherein the contacts 20 would be closed and thus would grip the solder balls 40 of a BGA device if one were in place within the socket 10. FIG. 6 illustrates the mechanism 16 in the open position wherein the contacts 20 are spread and ready to receive the solder balls 40 of the BGA device.

The mechanism 16 includes two identical U-shaped brackets 42 and 44 each having a formed cross piece 46 and two upstanding arms 48 and 50 extending substantially perpendicular to the cross piece 46. The two brackets 42 and 44 are nested facing each other and have their arms 48 and 50 pinned to each other at approximately their midpoints with a hole and slot arrangement which allows the arms 48 and 50 of each bracket 42 and 44 to slide relative to each other as the ends of the arms 48 and 50 move up and down. The lower portions of the cross pieces 46 are pivoted within slots in the base 12 and the upper portions of the cross pieces 46 engage the ends of the racks 32 which include the guides 36. The dimensions of the brackets 42 and 44 are chosen such that the upper portions of the cross pieces 46 are forced apart, and thus the arms 48 and 50 forced upwardly, when the contacts 20 are closed and thus the guides 36 are at their maximum separation. That the guides 36 are at their maximum separation is illustrated by comparing the positions of the plate 52 which supports the guides 36 on the right side of the socket 10 and the ends 54 of the racks 32 adjacent these guides 36. In FIG. 5, which corresponds to the closed position of the contacts 20, there is a large separation between the ends 54 of the racks 32 and the plate 52, which indicates that the guides 36 are at their widest separation. In FIG. 6, which corresponds to the open position of the contacts 20, the ends of the racks 32 have fully approached the plate 52, indicating maximum travel of the racks 32 and thus full opening of the contacts 20.

To insert a BGA device in the socket 10, the cover 14 is depressed which forces the ends of the arms 48 and 50 downwardly. This motion of the arms 48 and 50 causes the upper portions of the cross pieces 46 to approach each other and thus force the guides 36 and their associated racks 32 toward each other to open the contacts 20. The guides 36 are then in a position to define the placement of the BGA device on the top of the racks 32.

Once the BGA device is placed between the guides 36, the solder balls 40 attached to its bottom side are positioned within the open contacts 20 and the socket 10 is ready to be closed. Releasing the downward pressure on the cover 10 allows the natural resiliency of the contacts 20 to cause the contacts 20 to close around the solder balls 40. At the same time, the racks 32 are forced in opposite directions to fully separate the guides 36. This action raises the arms 48 and 50 and thus the cover 14.

Thus there has been described a test and burn-in socket for ball grid array integrated circuit devices which uses two contact arms to grip each solder ball of the device. Since two arms are used, forces are balanced on the device and a large contact area per ball is defined which prevents damage to the solder balls.

Although the invention has been described with respect to only a single embodiment, it will be recognized to those skilled in the art that many modifications are possible. For example, the cover could be removed entirely and the arms actuated directly. In addition, the arms could be longer or shorter to require a greater or lesser travel of the cover.

I claim:

1. A test socket for temporary connection of a ball grid array integrated circuit device to a test circuit, the test socket comprising:

a base of electrically insulating material;

an array of contacts supported by said base, said array at least including a pattern of contacts corresponding to the ball grid array of the integrated circuit device, each contact including a set of two cantilever arms biased toward each other and terminating in tips adapted to capture one ball of the ball grid array integrated circuit device;

means for simultaneously separating each of said sets of said array of contacts so that the balls of the ball grid array device maybe inserted one within each of said set of contact arms.

2. A test socket according to claim 1 wherein said tips of said contacts are offset with respect to the direction of movement of said tips and wherein said tips are twisted toward each other to engage the balls over a maximum area.

3. A test socket according to claim 1 wherein said means for separating said contact tips includes a rack associated with each of said tips and means for forcing adjacent racks in opposite directions.

4. A test socket according to claim 3 wherein said means for forcing said racks in opposite directions includes a linkage of two U-shaped pieces each of a cross piece and two upstanding arms, and wherein said arms are connected such that pressure on said arms at a point distant from said cross pieces causes said cross pieces to approach each other, and wherein said racks are disposed between said cross pieces and move with motion of said cross pieces.

5. A test socket according to claim 4 further including a cover including an opening for accepting a ball grid array device and a surface contacting said arm ends to pressure said arms as said cover is depressed and thus cause said cross pieces to approach each other.

6. A test socket according to claim 5 further including means on said base and said cover for cooperatively guiding said cover with respect to said base as said cover is depressed.

*7. A test socket for temporary connection of a ball grid array integrated circuit device to a test circuit, the test socket comprising:*

*a base of electrically insulating material;*

*an array of contacts supported by said base, said array at least including a pattern of contacts corresponding to the ball grid array of the integrated circuit device, each contact including a set of two cantilever arms biased toward each other and terminating in tips adapted to capture one ball of the ball grid array integrated circuit device; and*

*an engagement member within said test socket, said engagement member proximate said contacts to simultaneously separate each of said sets of arms of said array of contacts when said engagement member engages said contacts so that the balls of the ball grid array device maybe inserted one within each of said set of contact arms.*

*8. The test socket according to claim 7, wherein the tips of the contacts are offset with respect to the direction of movement of the tips and wherein the tips are twisted toward each other to engage the balls over a maximum area.*

*9. A test socket according to claim 7, wherein the engagement member includes at least one rack.*

*10. The test socket according to claim 7, wherein the engagement member includes a plurality of racks, at least one of the racks operating on a plurality of arms.*

*11. The test socket according to claim 7, said socket further comprising at least one bracket coupled to the engagement member, the bracket operating as a lever such that pressure on the bracket causes the engagement member to move and separate the contact arms.*

*12. A test socket according to claim 7, wherein the engagement member includes a plurality of racks, the socket further comprising at least two brackets operating as levers for forcing the racks in opposite directions, the brackets including a linkage of two U-shaped pieces each of a cross piece and two bracket arms, and wherein the bracket arms are connected such that pressure on the bracket arms at a point distant from the cross pieces causes the cross pieces to approach each other, and wherein the racks are disposed between the cross pieces and move with motion of the cross pieces.*

*13. The test socket according to claim 12, the socket further comprising a cover for accepting the ball grid array device, the cover coupled to the brackets to cause the cross pieces to approach each other as the cover is depressed.*

*14. The test socket according to claim 7, the socket further comprising a cover for accepting the ball grid array device, the cover coupled to the engagement member such that the engagement member separates the contact arms when the cover is depressed and allows the arms to capture balls of the ball grid array when the cover is released.*

*15. The test socket according to claim 7, the engagement member engaging at least one arm of each of the contacts.*

*16. The test socket according to claim 7, the engagement member engaging both arms of each of the contacts.*

*17. A socket for connection of a ball grid array integrated circuit device to a circuit, the socket comprising:*

*a base;*

*an array of contacts supported by said base, said array at least including a pattern of contacts corresponding to the ball grid array of the integrated circuit device, at least some of said contacts including a set of two cantilever contact arms biased toward each other and terminating in tips adapted to receive one ball of the ball grid array integrated circuit device; and*

*a sliding plate within said test socket, said sliding plate adapted to separate said arms so that a ball of the ball grid array device may be received within one set of said contact arms.*

*18. The socket according to claim 17, the socket further comprising a plurality of the sliding plates.*

*19. The socket according to claim 17, the socket further comprising a bracket coupled to the sliding plate, pressure on the bracket causing the sliding plate to move and thus separate the contact arms.*

*20. The socket according to claim 19, the socket further comprising a cover for accepting the ball grid array device, the cover coupled to the bracket to cause the contact arms to separate when the cover is depressed.*

*21. The socket according to claim 17, the socket further comprising a cover for accepting the ball grid array device, the cover coupled to the sliding plate such that the sliding plate separates the contact arms when the cover is depressed.*

*22. The socket according to claim 17, the sliding plate engaging at least one arm of each of the contacts.*

*23. The socket according to claim 22, the socket being a test socket for temporary connection of the ball grid array device to a test circuit.*

*24. A socket for connection of a ball grid array integrated circuit device to a circuit, the socket comprising:*

*a base;*

*an array of contacts supported by said base, said array at least including a pattern of contacts corresponding to the ball grid array of the integrated circuit device, at least some of said contacts including a set of two cantilever arms biased toward each other and terminating in tips adapted to receive one ball of the ball grid array integrated circuit device; and*

*a rack within said test socket, said rack separating at least one arm of each of said sets of arms so that at least one ball of the ball grid array device may be inserted within at least one of said set of contact arms.*

*25. The socket according to claim 24, said socket further comprising a bracket coupled to the rack, pressure on the bracket causing the rack to move and thus separate the contact arms.*

*26. The socket according to claim 25, the socket further comprising a cover for accepting the ball grid array device, the cover coupled to the bracket to cause the contact arms to separate when the cover is depressed.*

*27. The test socket of claim 25, said socket further comprising a plurality of said racks, said racks being slidable to engage at least two arms of each of said contacts.*

*28. The test socket of claim 24, said rack being slidable to engage one arm of each of said contacts.*

*29. The socket according to claim 24, the socket further comprising a cover for accepting the ball grid array device, the cover coupled to the rack such that the rack separates the contact arms when cover is depressed.*

*30. The socket according to claim 24, the socket being a test socket for temporary connection of the ball grid array device to a test circuit.*

*31. A socket for connection of a ball grid array integrated circuit device to a circuit, the socket comprising:*

*a plurality of contacts within said socket, at least some of said contacts including a set of at least two arms, said arms terminating in tips adapted to receive one ball of the ball grid array integrated circuit device; and*

*a moveable engagement member proximate said plurality of contacts, said member capable of separating said sets of arms when said member is moved so that at least one ball of the ball grid array device maybe inserted within one of said sets of contact arms.*

*32. The socket according to claim 31, said socket further comprising a bracket coupled to the engagement member, pressure on the bracket causing the engagement member to move and thus separate the contact arms.*

*33. The socket according to claim 32, the socket further comprising a cover for accepting the ball grid array device, the cover coupled to the bracket to cause the contact arms to separate when the cover is depressed.*

*34. The socket according to claim 31, the socket further comprising a cover for accepting the ball grid array device, the cover coupled to the engagement member such that the engagement member separates the contact arms when the cover is depressed.*

*35. The socket of claim 34, said engagement member being formed of multiple sub-members to slidably engage at least two arms of each of said contacts.*

*36. The socket of claim 34, said engagement member being slidable to engage one arm of each of said contacts.*

*37. The socket according to claim 36, the socket being a test socket for temporary connection of the ball grid array device to a test circuit.*

*38. A test socket for temporary connection of a ball grid array integrated circuit device to a test circuit, the test socket comprising:*

*a base;*

*an array of contacts supported by said base, said array at least including a pattern of contacts corresponding to the ball grid array of the integrated circuit device, each contact including a set of two cantilever arms biased toward each other and terminating in tips to receive one ball of the ball grid array integrated circuit device;*

*a moveable contact engagement member within said test socket, said contact engagement member proximate said contacts;*

*a moveable cover having an opening for accepting the ball grid array device; and*

*at least one moveable bracket coupled to said contact engagement member and said cover, said cover engaging said bracket when said cover is depressed, said bracket transmitting force to said engagement member to simultaneously separate each of said sets arms when said cover is depressed so that the balls of the ball grid array device may be inserted within the sets of said contact arms.*

*39. The test socket of claim 38, further comprising a plurality of said brackets.*

*40. The test socket of claim 38, wherein said bracket is U-shaped.*

*41. The test socket of claim 38, wherein at least one arm of each of said set of arms is moved to accomplish said separation of said arms.*

*42. The test socket of claim 38, wherein one arm of each of said set of arms is engaged by said engagement member.*

*43. The test socket of claim 42 wherein both arms of each of said set of arms are moveable.*

*44. A method of operating a test socket for temporary connection of a ball grid array integrated circuit device to a test circuit, the method comprising:*

*providing a base of electrically insulating material;*

*providing an array of contacts supported by said base, said array at least including a pattern of contacts corresponding to the ball grid array of the integrated circuit device, each contact including a set of two cantilever arms biased toward each other and terminating in tips adapted to capture one ball of the ball grid array integrated circuit device; and*

*simultaneously separating each of said sets of arms so that the balls of the ball grid array device may be inserted one within each of said set of contact arms.*

*45. The method of claim 44, said separating step further comprising depressing a cover of said socket to actuate the separation of said arms.*

*46. The method of claim 45, wherein said cover presses against a bracket when said cover is depressed.*

*47. The method of claim 44, said separating step further comprising:*

*depressing a cover of said test socket to move at least one bracket within said test socket; and*

*engaging at least one arm of each of said sets of contact arms when said bracket is moved so as to separate each of said sets of arms.*

*48. A method of operating a test socket for temporary connection of a ball grid array integrated circuit device to a test circuit, the method comprising:*

*providing a base of electrically insulating material;*

*providing an array of contacts supported by said base, said array at least including a pattern of contacts corresponding to at least a subset of balls of the ball grid array of the integrated circuit device, each contact including a set of two cantilever arms biased toward each other and terminating in tips adapted to capture one ball of the ball grid array integrated circuit device;*

*depressing a cover of said test socket to move at least one bracket within said test socket; and*

*engaging at least one arm of each of said sets of contact arms when said bracket is moved so as to separate each of said sets of arms a distance sufficient to allow at least one of the balls of the ball grid array device to be inserted within at least one of said set of contact arms.*

*49. The method of claim 48, wherein depressing said cover moves a plurality of brackets.*

*50. The method of claim 48, wherein said movement of said bracket actuates an engagement member to cause movement of at least one arm of each of said sets of contact arms.*

*51. The method of claim 48, said method further comprising placing a ball grid array device within said set of contact arms.*

*52. The method of claim 51, said method further comprising releasing said cover to allow said contact arms to contact the balls of said ball grid array.*

*53. A method of operating a socket for connection of a ball grid array integrated circuit device to a circuit, the method comprising:*

*providing an array of contacts, at least some of said contacts including a set of at least two arms, said arms terminating in tips adapted to receive one ball of the ball grid array integrated circuit device; and*

*separating each of said sets arms so that the balls of the ball grid array device may be inserted within said sets of contact arms.*

*54. The method of claim 53, said contact arms being cantilevered to allow movement of at least two arms of each set of arms.*

*55. The method of claim 54, said separating step further comprising depressing a cover of said socket to actuate the separation of said arms.*

*56. The method of claim 55, wherein said cover presses against a bracket when said cover is depressed.*

*57. The method of claim 53, said separating step further comprising:*

*depressing a cover of said test socket to move at least one bracket within said test socket; and*

*engaging at least one arm of each of said sets of contact arms when said bracket is moved so as to separate each of said sets of arms.*

*58. A method of forming a test socket for the temporary connection of a ball grid array integrated circuit device to a test circuit, the method comprising:*

*forming a base; and*

*forming an array of contacts supported by said base, said array at least including a pattern of contacts corresponding to the ball grid array of the integrated circuit device, each contact including a set of two cantilever arms biased toward each other and terminating in tips adapted to receive one ball of the ball grid array integrated circuit device;*

*wherein each of said sets of arms are separable so that the balls of the ball grid array device maybe inserted within said sets of contact arms.*

*59. The method of claim 58, further comprising coupling a cover to said socket so that actuation of the separation of said arms may be accomplished by depressing said cover.*

*60. The method of claim 59, further comprising coupling a moveable bracket to said cover.*

*61. The method of claim 58, further comprising:*

*coupling a cover of said socket to at least one bracket within said test socket so that depressing said cover moves said bracket; and*

*coupling said bracket to a slidable member, said slidable member proximate at least one arm of each of said sets of contact arms such that movement of said bracket may separate each of said sets of arms when said cover is depressed and may allow closure of the arms when said cover is released.*

*62. The method of claim 61, said contact arms being cantilevered to allow movement of at least two arms of each set of arms.*

*63. The method of claim 58, said contact arms being cantilevered to allow movement of at least two arms of each set of arms.*

* * * * *